(12) United States Patent
Gardner et al.

(10) Patent No.: US 9,245,695 B2
(45) Date of Patent: Jan. 26, 2016

(54) INTEGRATION OF ENERGY STORAGE DEVICES ONTO SUBSTRATES FOR MICROELECTRONICS AND MOBILE DEVICES

(75) Inventors: Donald S. Gardner, Los Altos, CA (US); Cary L. Pint, Hayward, CA (US); Charles W. Holzwarth, San Jose, CA (US); Wei Jin, Sunnyvale, CA (US); Zhaohui Chen, San Jose, CA (US); John L. Gustafson, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 13/995,138

(22) PCT Filed: Dec. 21, 2011

(86) PCT No.: PCT/US2011/066650
§ 371 (c)(1),
(2), (4) Date: Jun. 17, 2013

(87) PCT Pub. No.: WO2013/095466
PCT Pub. Date: Jun. 27, 2013

(65) Prior Publication Data
US 2014/0226260 A1    Aug. 14, 2014

(51) Int. Cl.
*H01G 9/00* (2006.01)
*H01G 11/56* (2013.01)
(Continued)

(52) U.S. Cl.
CPC .............. *H01G 11/56* (2013.01); *H01G 11/04* (2013.01); *H01G 11/26* (2013.01); *H01G 11/30* (2013.01); *H01G 11/54* (2013.01); *H01G 11/84* (2013.01);
(Continued)

(58) Field of Classification Search
USPC ......... 361/502, 503–504, 509–512, 516–519, 361/523–525, 528–529
See application file for complete search history.

(56) References Cited

U.S. PATENT DOCUMENTS

2006/0021649 A1* 2/2006 Kuroda et al. ................ 136/263
2010/0216026 A1* 8/2010 Lopatin et al. ................ 429/246

FOREIGN PATENT DOCUMENTS

WO    WO 2011123135 A1    10/2011

OTHER PUBLICATIONS

Desplobain, et al., "Investigations on porous silicon as electrode material in electrochemical capacitors," Wiley InterScience, Phys. Stat. Sol.,4, No. 6, pp. 2180-2184, 2007.

(Continued)

*Primary Examiner* — Nguyen T Ha
(74) *Attorney, Agent, or Firm* — Blakely, Sokoloff, Taylor & Zafman LLP

(57) ABSTRACT

In an embodiment of the invention, an energy storage device is described including a pair of electrically conductive porous structures, with each of the electrically conductive porous structures containing an electrolyte loaded into a plurality of pores. A solid or semi-solid electrolyte layer separates the pair of electrically conductive porous structures and penetrates the plurality of pores of the pair of electrically conductive porous structures. In an embodiment of the invention, an electrically conductive porous structure is formed on a substrate, the electrically conductive porous structure containing a plurality of pores. An electrolyte is then loaded into the plurality of pores, and an electrolyte layer is formed over the electrically conductive porous structure. In an embodiment, the electrolyte layer penetrates the plurality of pores of the electrically conductive porous structure.

34 Claims, 10 Drawing Sheets

(51) Int. Cl.
*H01G 11/04* (2013.01)
*H01G 11/26* (2013.01)
*H01G 11/30* (2013.01)
*H01G 11/54* (2013.01)
*H01G 11/86* (2013.01)
*H01L 49/02* (2006.01)
*H01G 11/84* (2013.01)

(52) U.S. Cl.
CPC ................ *H01G 11/86* (2013.01); *H01L 28/84* (2013.01); *H01G 2009/0007* (2013.01); *Y02E 60/13* (2013.01); *Y10T 29/417* (2015.01)

(56) References Cited

OTHER PUBLICATIONS

PCT International Search Report and Written Opinion for International Application No. PCT/US2011/066650, mailed Sep. 17, 2012, 10 pages.

\* cited by examiner

INTEGRATION OF ENERGY STORAGE DEVICES ONTO SUBSTRATES FOR MICROELECTRONICS AND MOBILE DEVICES

CROSS-REFERENCE TO RELATED APPLICATION

This patent application is a U.S. National Phase application under 35 U.S.C. §371 of International Application No. PCT/US2011/066650, filed Dec. 21, 2011, entitled INTEGRATION OF ENERGY STORAGE DEVICES ONTO SUBSTRATES FOR MICROELECTRONICS AND MOBILE DEVICES.

BACKGROUND

The disclosed embodiments of the invention relate generally to energy storage devices, and relate more particularly to versatile methods of integrating mechanically robust energy storage devices.

Modern societies depend on the ready availability of energy. As the demand for energy increases, devices capable of efficiently storing energy become increasing important. As a result, energy storage devices, including batteries, capacitors, electrochemical capacitors (ECs), (including pseudocapacitors and electric double-layer capacitors (EDLCs)—also known as ultracapacitors, among other names), hybrid ECs, and the like are being extensively used in the electronics realm and beyond. In particular, capacitors are widely used for applications ranging from electrical circuitry and power delivery to voltage regulation and battery replacement. Electrochemical capacitors are characterized by high energy storage capacity as well as other desirable characteristics including high power density, small size, and low weight, and have thus become promising candidates for the use in several energy storage applications.

In a related application PCT/US2010/029821, published as WO 2011/123135, three-dimensional structures for forming high energy density electrochemical capacitors are disclosed. In some of the disclosed embodiments, a wet etching process is used to etch pores deep into a silicon structure and the pores are filled with an electrolyte or with a high-k dielectric material and/or a thin conductive film in combination with an electrolyte.

BRIEF DESCRIPTION OF THE DRAWINGS

The disclosed embodiments will be better understood from a reading of the following detailed description, taken in conjunction with the accompanying figures in the drawings in which.

Figure 1:
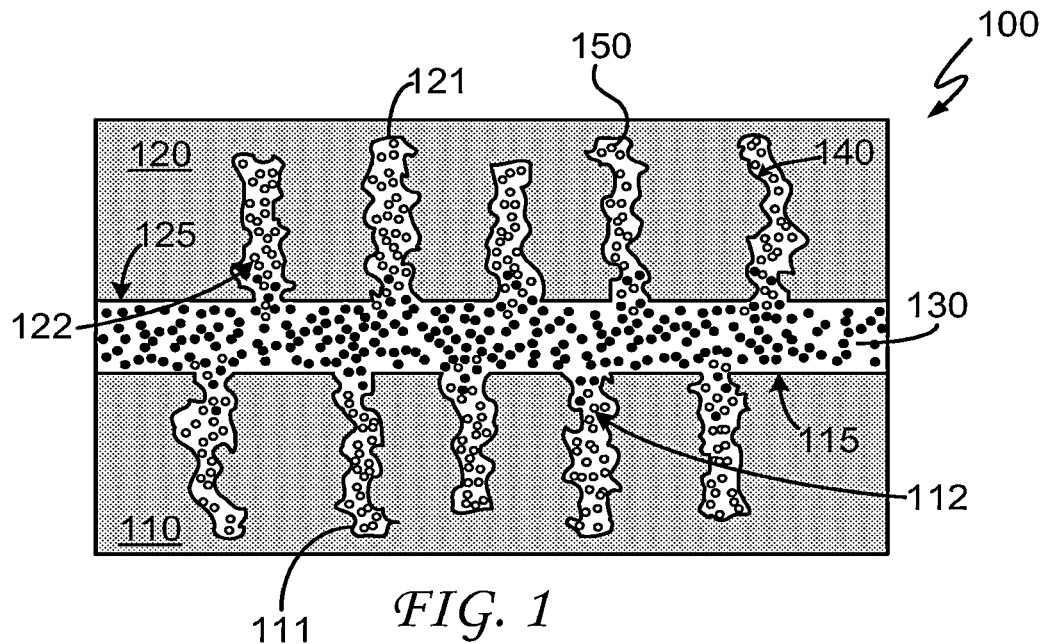
FIGS. 1-2 are cross-sectional side view illustrations of an energy storage device according to embodiments of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. Certain figures may be shown in an idealized fashion in order to aid understanding, such as when structures are shown having straight lines, sharp angles, and/or parallel planes or the like that under real-world conditions would likely be significantly less symmetric and orderly. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions unless otherwise indicated either specifically or by context. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION

In one embodiment of the invention, an energy storage device is described including a pair of electrically conductive porous structures, with each of the electrically conductive porous structures containing an electrolyte loaded into a plurality of pores. A solid or semi-solid electrolyte layer separates the pair of electrically conductive porous structures and penetrates the plurality of pores of the pair of electrically conductive porous structures. In an embodiment, the pair of electrically conductive porous structures may be porous semiconductor structures. A defining property of a semiconductor material is that it can be doped with impurities that alter its electronic properties in a controllable way.

In another embodiment of the invention, a method of forming an energy storage device is described in which an electrically conductive porous structure is formed on a substrate, the electrically conductive porous structure containing a plurality of pores. The electrically conductive porous structure may be formed using a variety of versatile techniques that can simplify integration of the energy storage device onto a package or into the body of an electronic device. For example, techniques such as thermal spraying or casting followed by etching, aerogel or electrospinning may be used. In an embodiment, thermal spraying may include plasma spraying silicon particles and suitable doping with a high-temperature torch using a carrier gas. In an embodiment, the films can be plasma sprayed onto a mechanical support structure and then electrochemically etched. Roll-to-roll techniques can also be used to deposit the plasma sprayed silicon to lower the cost. An electrolyte is then loaded into the plurality of pores, and an electrolyte layer is formed over the electrically conductive porous structure. In an embodiment, the electrolyte layer penetrates the plurality of pores of the electrically conductive porous structure. In an embodiment, a pair of electrically conductive porous structures are brought together with the electrolyte layer separating the pair of electrically conductive porous structures, and the electrolyte layer is polymerized to form a solid or semi-solid electrolyte layer.

In one aspect, embodiments of the invention employ versatile techniques that simplify integration of energy storage devices onto packages or in the body of an electronic device. Such techniques may be used to apply an electrically conductive porous structure to various substrates and surfaces, and make thin energy storage devices for applications that need thin form factors. For example, in one embodiment an energy storage device is integrated in the casing of a mobile electronics device.

The energy storage devices can be directly formed onto or transferred onto substrates used for packaging microelectronics with other microchips using materials such as porous silicon, graphene, carbon nanotubes, nanowires or other porous materials. The energy storage devices can be used to provide power for circuit functions such as turbo modes in microprocessors because they would be located closer to the microprocessors than other energy sources such as circuit-board capacitors. The energy storage device could also be part of a silicon bridge substrate. A conventional silicon bridge may be a passive substrate with conductive wiring connecting two die. In an embodiment of the present invention, the energy storage device is formed on a silicon bridge connecting two die. In this manner, it may be possible to locate the energy storage device in close proximity to a microprocessor in order to quickly provide power to the microprocessor, for example during turbo mode.

In another aspect, embodiments of the invention provide physically robust energy storage device structures which may be load bearing, and may not require additional surrounding support structures. For example, such a load bearing ability may be particularly beneficial when the energy storage device is integrated in the casing of a mobile electronics device. In some embodiments, a solid or semi-solid electrolyte layer separates a pair of electrically conductive porous structures and penetrates the pair of electrically conductive porous structures. In this manner, in addition to separating the pair of electrically conductive porous structures, the solid or semi-solid electrolyte layer may also provide additional load bearing structural stability to the energy storage device by virtue of intermixing or chemical bonding with the electrolyte contained within the electrically conductive porous structures and/or additional mechanical interlocking or chemical bonding with the electrically conductive porous structures.

Polymer-based electrolytes having high mechanical strength and high ionic conductivity can be integrated to provide robustness to the energy storage device. Polyethylene oxide (PEO), for example, can be utilized as a polymer electrolyte permitting high ionic conductivity. PEO can also be formed as a co-polymer with a polymer having a stronger backbone structure, such as polyimide (PI). In such a structure, the PI-PEO network may contain a higher molecular weight PI backbone and a lower molecular weight PEO side chain, which enables the structure to exhibit good mechanical properties from the strong backbone structure, and good ionic conductivity from the interconnected PEO ionic conduction channels. Potential benefits of using such polymer-based electrolytes may include safety, ease of scale-up processing, good thermal properties, and the ability to be laminated onto structures. In other embodiments, ionic liquids can be solvated in the polymer(s) to form ionic polymer electrolyte systems.

Although much of the discussion herein will focus on electrochemical capacitors (including pseudocapacitors and electric double-layer capacitors), the "energy storage device" designation explicitly includes, in addition to ECs, hybrid ECs, as well as batteries, fuel cells, and similar devices that store energy. Energy storage devices according to embodiments of the invention can be used for a wide variety of applications, including in automobiles, buses, trains, airplanes, other transportation vehicles, home energy storage, storage for energy generated by solar or wind energy generators (especially energy harvesting devices), microelectronic devices, mobile electronic devices and many others.

Electrochemical capacitors operate according to principles similar to those that govern conventional parallel plate capacitors, but certain important differences do apply. One significant difference concerns the charge separation mechanism. For one important class of ECs this typically takes the form of a so-called electric double layer, or EDL, rather than of the dielectric of a conventional capacitor. The EDL is created by the electrochemical behavior of ions at an interface between a high-surface area electrode and an electrolyte, and results in an effective separation of charge in spite of the fact that the layers are so close together. (Physical separation distances are on the order of a single nanometer.) Thus, a typical EDL capacitor may be thought of as storing charge in its EDL. Each layer of the EDL is electrically conductive but the properties of the double layer prevent current from flowing across the boundary between them. (The EDL is further discussed below in connection with FIG. 4.)

As is true in conventional capacitors, capacitance in an EDL capacitor is proportional to the surface area of the electrodes and inversely proportional to the charge separation distance. The very high capacitances achievable in an EDL capacitor are due in part to the very high surface area attributable to the porous structure and to the nanometer-scale charge separation distance attributable to the EDL, which arises due to the presence of an electrolyte, as explained above.

Another class of electrochemical capacitor is the pseudocapacitor, where instead of EDL capacitance a different kind of capacitance—one that is faradaic and not electrostatic in origin—can arise at certain types of electrodes. This different kind of capacitance is called "pseudocapacitance." Pseudocapacitors are energy storage devices that behave like capacitors but also exhibit reactions that result in charge storage. Typically, one of the electrodes of a pseudocapacitor is coated with a transition metal oxide such as $MnO_2$, $RuO_2$, $NiO_x$, $Nb_2O_5$, $V_2O_5$, etc., or with other materials including $Mo_2N$, VN, $W_2N$, $W_2C$ (tungsten carbide), $Mo_2C$, VC, a suitable conducting polymer, or a similar material. These materials can be used with an electrolyte such as potassium hydroxide (KOH); when the device is charged, the electrolyte will react with the material in a reaction that allows energy to be stored in a manner that has similarities to a battery's energy storage. More specifically, these materials store energy through highly-reversible surface and subsurface redox (faradic) reactions, but at the same time the electric double layer energy storage mechanism remains in place and provides the potential for high power.

Hybrid electrochemical capacitors are energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Figure 2:
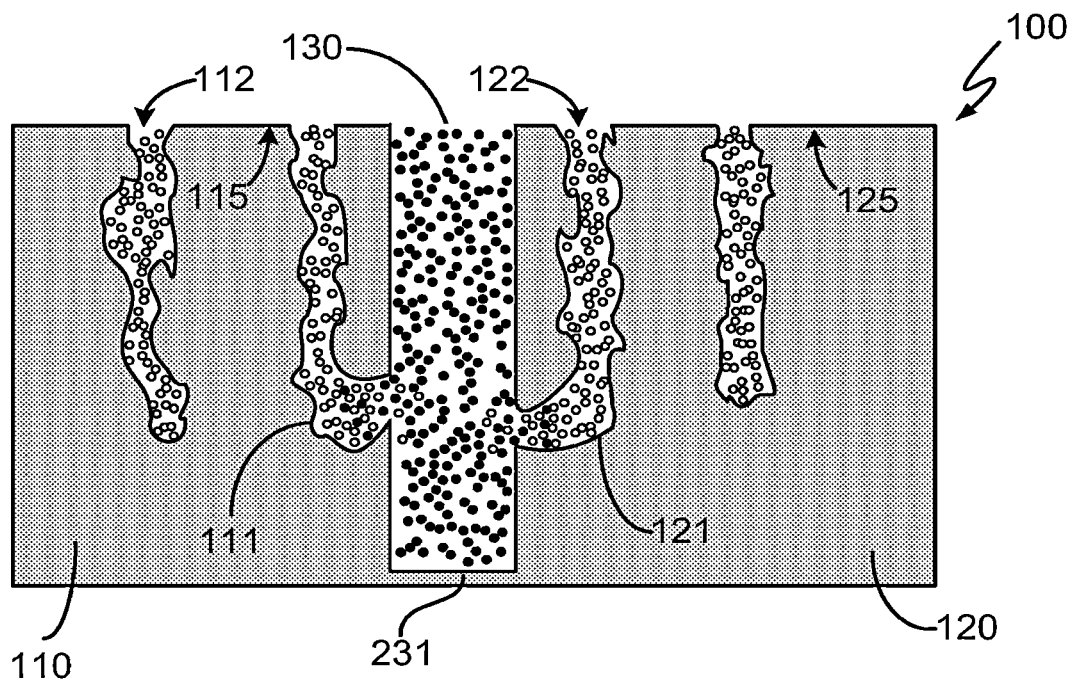

FIGS. 1-2 are cross-sectional views of an energy storage device 100 according to an embodiment of the invention. As illustrated in FIGS. 1 and 2, energy storage device 100 comprises an electrically conductive structure 110 and an electrically conductive structure 120. At least one of electrically conductive structures 110 and 120 comprises a porous structure. In the embodiment illustrated in FIGS. 1-2, both of the electrically conductive structures comprise an electrically conductive porous structure. In the particular embodiment illustrated, the porous structure contains multiple channels, each one of which has an opening to a surface of the porous structure. This feature may be the result of an electrochemical etching process, described below, used to form the porous structure. As an example, the porous structure may be formed within an electrically conductive material such as a conductive material or semiconductive material. Alternatively, the porous structure may be formed within an insulating material (e.g. alumina) that has been coated with an electrically conductive film (e.g., an ALD conductive film such as titanium nitride (TiN)). In this regard, materials having greater electrical conductivity are advantageous because they lower the effective series resistance. In the illustrated embodiments both electrically conductive structure 110 and electrically conductive structure 120 comprise such a porous structure. Accordingly, in some embodiments electrically conductive structure 110 comprises channels 111 with openings 112 to a surface 115 of the corresponding porous structure and electrically conductive structure 120 comprises channels 121 with openings 122 to a surface 125 of the corresponding porous structure. In an embodiment where only one of electrically conductive structures 110 and 120 comprises a porous structure with multiple channels, the other electrically conductive structure can be, for example, a metal electrode or a polysilicon structure. In other embodiments, the porous structure has a different morphology than that illustrated in FIGS. 1-2, which may be the result of, for example, an aerogel or electrospinning technique.

As just described, in an embodiment, an electrically conductive porous structure is formed within the electrically conductive structure by electrochemical etching. Where the electrically conductive substrate is silicon, the electrochemical etching bath solution may include hydrofluoric acid (HF) or HF-ethanol solutions, for example. Where electrochemical etching is utilized to form the porous structure in an electrically conductive structure, the electrically conductive structure can be provided by a variety of manners. For example, the electrically conductive structure can be a portion of a silicon wafer, or layer of silicon deposited on a substrate. The silicon can be grown using techniques such as epitaxial deposition and chemical vapor deposition (CVD). In an embodiment, less expensive methods may be employed in which the silicon layer can be deposited on a variety of substrates and surfaces. In an embodiment, thermal spraying (e.g. plasma spraying) of silicon particles can be utilized to form a silicon layer. In an embodiment, the silicon particles are poly-crystalline. In another embodiment, casting techniques can be utilized to form a silicon layer of silicon particles. Besides silicon, other materials may also be used such as porous germanium and porous tin. Possible advantages of using porous silicon include its compatibility with existing silicon technology. Porous germanium enjoys a similar advantage as a result of existing technology for that material and, as compared to silicon, enjoys the further possible advantage that its native oxide (germanium oxide) is water-soluble and so is easily removed. (The native oxide that forms on the surface of silicon may trap charge—which is an undesirable result—especially where the silicon porosity is greater than about 20 percent.) Porous germanium is also highly compatible with silicon technology. Possible advantages of using porous tin, which is a zero-band-gap material, include its enhanced conductivity with respect to certain other conductive and semiconductive materials. Other materials may also be used for the porous structure, including silicon carbide, alloys such as an alloy of silicon and germanium, and metals such as copper, aluminum, nickel, calcium, tungsten, molybdenum, and manganese.

In an embodiment, an electrically conductive porous structure is formed with an aerogel technique. For example, a gel can be deposited onto a substrate, and then a liquid component is extracted from the gel via processes such as supercritical drying and freeze-drying. Aerogel adhesion to the substrate can be achieved by using controlled texturing of the substrate surface. Materials which may be suited for formation of the electrically conductive porous structure with an aerogel technique include silicon, carbon, vanadium, molybdenum, ruthenium, and manganese. A possible advantage for using such a drying process is that use of low temperature processing may be compatible with polymers used in microelectronics packaging. In an embodiment, an electrically conductive porous structure is formed using a thick photoresist and electrospinning conductive nanostructures (e.g. carbon nanotubes) onto a substrate.

Various configurations of energy storage device 100 are possible. In the embodiment of FIG. 1, for example, energy storage device 100 comprises two distinct electrically conductive porous structures (that is, electrically conductive structure 110 and electrically conductive structure 120) that have been bonded together face-to-face with separator 130 in between. As another example, in the embodiment of FIG. 2 energy storage device 100 comprises a single planar electrically conductive porous structure in which a first section (electrically conductive structure 110) is separated from a second section (electrically conductive structure 120) by a trench 231 containing separator 130. One of the electrically conductive structures will be the positive side and the other electrically conductive structure will be the negative side.

FIG. 2 shows a small bridge of material connecting electrically conductive structure 110 and electrically conductive structure 120. If left unaddressed, this bridge may act as an electrical short between the two electrically conductive structures. There are several possible solutions, however. For example, the bridge may be removed using a polishing operation. The conductive structure may then be held apart by some other means or by the separator 130 in accordance with embodiments of the invention. Alternatively, the electrically conductive structures may be formed in a heavily-doped top layer or region of a wafer while the trench extends down to an underlying lightly-doped substrate that is not a very good conductor. Alternatively, further processing may be performed on the bridge to make it less conductive such as an oxidation step, Or a silicon-on-insulator structure may be used.

It should also be noted that the depictions of the porous structures in FIGS. 1-2 are highly idealized in that, to mention just one example, all of channels 111 and 121 are shown as only extending vertically. In reality the channels would branch off in multiple directions to create a tangled, disorderly pattern that may look something like the porous structure shown in FIG. 3.

Figure 3A:
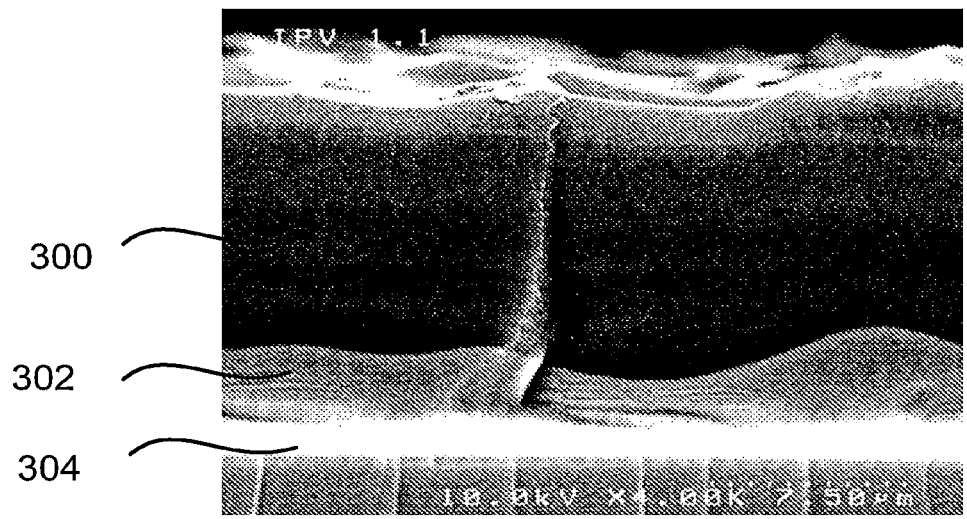
FIG. 3A-3B are cross-sectional side view scanning electron microscope images of a piece of porous silicon according to an embodiment of the invention.
Figure 3B:
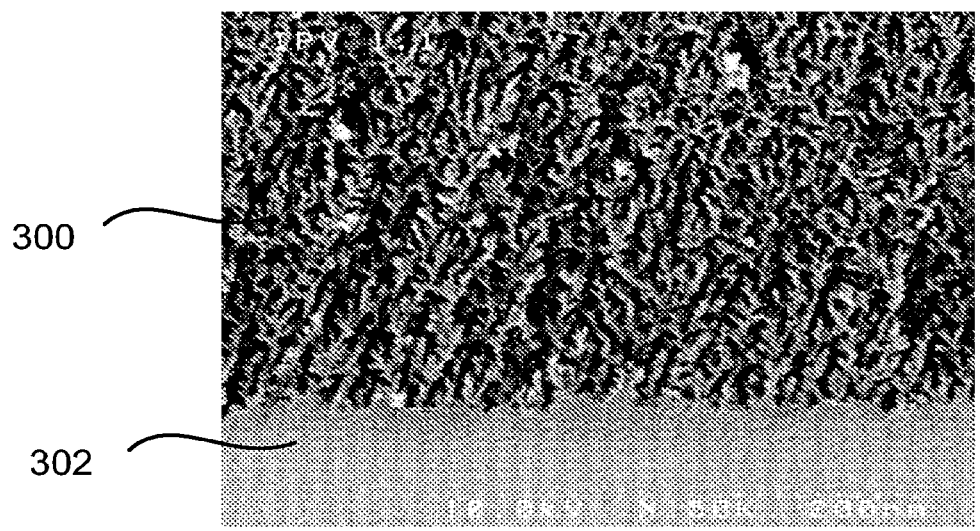

FIG. 3A is a cross-sectional side view scanning electron microscope (SEM) image of a silicon layer plasma sprayed onto a $SiO_2$ layer 304 on silicon and then electrochemically etched to form a porous silicon structure according to an embodiment of the invention. In the embodiment illustrated in FIG. 3, a layer 302 of un-etched silicon remains underneath the etched porous silicon structure 300. In one embodiment, un-etched layer 302 acts as a support structure for porous structure 300 (and for the corresponding energy storage device, not shown). FIG. 3B is a magnified image of FIG. 3A showing the morphology at the bottom of the porous silicon structure 300 on the un-etched silicon layer 302.

Referring again to FIGS. 1-2, the separator 130 prevents the physical contact of anode and cathode (which would cause an electrical malfunction in the device) while permitting the transfer of ionic charge carriers. For example, separator 130 could be a permeable membrane or other porous polymer separator. In addition to polymer separators, several other separator types are possible. These include nonwoven fiber sheets, liquid membranes, polymer electrolytes, solid ion conductors, and the like. Separator 130 may be a solid or semi-solid (e.g. gel) material which provides structural rigidity to the energy storage device 100. In an embodiment, separator 130 is a solid or semi-solid electrolyte which both permits the transfer of ionic charge carriers and prevents physical contact of the two conductive structures. In an embodiment, the solid or semi-solid electrolyte separator 130 penetrates into the porous structure of at least one of the electrically conductive structures 110, 120 as illustrated in FIGS. 1-2 and described in more detail in the following paragraphs. In this manner, in addition to providing the role of a spacer, separator 130 may also provide additional load bearing structural stability to the energy storage device 100 by virtue of intermixing or chemical bonding with electrolyte 150 and/or additional mechanical interlocking or chemical bonding with the porous structure. In an embodiment, the solid or semi-solid electrolyte comprises a polymer matrix which provides structural rigidity. To provide additional ionic transfer, an ionic liquid can be mixed with the polymer matrix in the separator 130. The polymer matrix may also comprise a co-polymer. For example, the co-polymer can include a first polymer to provide a structural backbone of the polymer matrix, and a second polymer to provide increased ionic conductivity. As an example, the co-polymer can include a polyimide backbone and polyethylene oxide for ionic conductivity. In an embodiment, the molecular weight of the polyimide is higher than the molecular weight of the polyethylene oxide.

Also illustrated in FIGS. 1-2 is an electrolyte 150, which gives rise to the EDL. In some embodiments electrolyte 150 is organic. One type of electrolyte that may be used in accordance with embodiments of the invention is an ionic solution (liquid or solid). Another is an electrolyte (e.g., $Li_2SO_4$, $LiPF_6$) comprising an ion-containing solvent. As one example, the electrolyte can be a liquid or solid solution of organic materials such as tetraethylammonium tetrafluoroborate in acetonitrile. Other examples include solutions based on boric acid, sodium borate, or weak organic acids. Organic electrolytes and solid-state electrolytes are also possible. In a particular embodiment, electrolyte 150 is a liquid electrolyte solution, and separator 130 is a solid or semi-solid electrolyte. However, electrolyte 150 may also be the same material used to form separator 130. Electrolyte 150 and the solid or semi-solid electrolyte separator 130 are represented in the drawings using a random arrangement of circles, with electrolyte 150 being represented by un-filled circles and solid or semi-solid electrolyte separator 130 represented by filled circles. This representation is intended to convey the idea that the electrolytes 130, 150 are substances (liquid or solid, including gel-like materials) containing free ions. The circles were chosen for convenience and are not intended to imply any limitation as to the components or qualities, including any limitation with respect to the size, shape, or number of the ions. The circles were also chosen to clearly illustrate penetration of the solid or semi-solid electrolyte separator 130 into the porous structures of the electrically conductive structure 110, 120, as well as the possibility of penetration of electrolyte 150 into the solid or semi-solid electrolyte separator 130. In the particular embodiment illustrated in FIGS. 1-2, the electrolytes 130, 150 are illustrated as intermixing in the regions at the surfaces 115, 125 of the channels 111, 121 (or pores). In accordance with embodiments of the invention, the amount of intermixing of electrolytes 130, 150 can be controlled. For example, in another embodiment, electrolyte 130 (represented by the filled circles) penetrates a substantial portion of the channels 111, 121 (or other porous structure), and may even completely penetrate the channels 111, 121 (or other porous structure). Likewise, the electrolyte 150 (represented by the un-filled circles) penetration into electrolyte 150 can be controlled.

Figure 4:
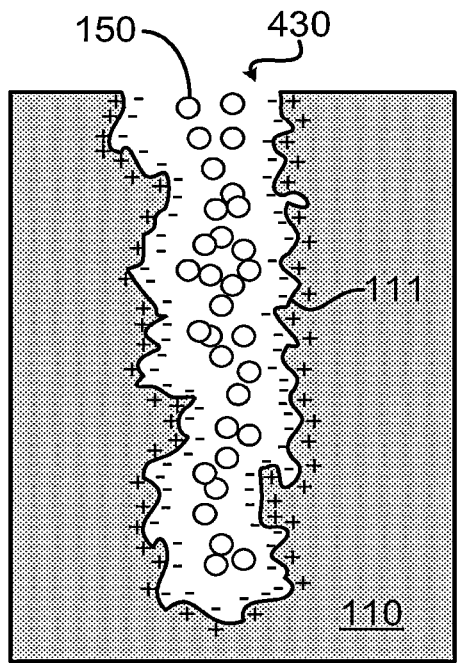
FIG. 4 is a cross-sectional side view illustration of an electric double layer within a porous structure of an energy storage device according to an embodiment of the invention.

FIG. 4 schematically depicts an electrical double layer (EDL) 430 formed within one of channels 111 with electrolyte 150. It is to be appreciated that while only electrolyte 150 is shown within the channel 111, that electrolyte 130 may also be present within the channel 111 and contribute to the EDL depending upon the amount of penetration. EDL 430 is made up of two layers of charge, one of which is the electrical charge of the sidewalls of channel 111 (depicted as being positive in FIG. 4 but which could also be negative) and the other of which is formed by free ions in the electrolyte. EDL 430 electrically insulates the surface, thus providing the charge separation necessary for the capacitor to function. The large capacitance and hence energy storage potential of EDLCs arises due to the small (approximately 1 nm) separation between electrolyte ions and the electrode surface charge.

Referring again to FIGS. 1-2, energy storage device 100 may further include an electrically conductive coating 140 on at least a portion of the porous structure and in at least some of channels 111 and/or channels 121. Such an electrically conductive coating may be necessary in order to maintain or enhance the conductivity of the porous structure, or it may be helpful in reducing ESR, thereby improving performance. For example, a device having lower ESR is able to delivery higher power (which may be manifested in terms of greater acceleration, more horse power, etc.). In contrast, higher ESR (a condition that prevails inside a typical battery) limits the amount of available energy, at least partially due to the fact that much of the energy is wasted as heat. As an example, electrically conductive coating 140 may be a silicide. As another example, electrically conductive coating 140 may be a coating of metal such as, for example, aluminum, copper, and tungsten, or other electrical conductors such as tungsten nitride, titanium nitride, tantalum nitride, and vanadium nitride. Each of the listed materials has the advantage of being used in existing CMOS technology. Other metals such as nickel and calcium may also be used as electrically conductive coating 140. These materials may be applied using processes such as electroplating, chemical vapor deposition (CVD), and/or atomic layer deposition (ALD).

Figure 5:
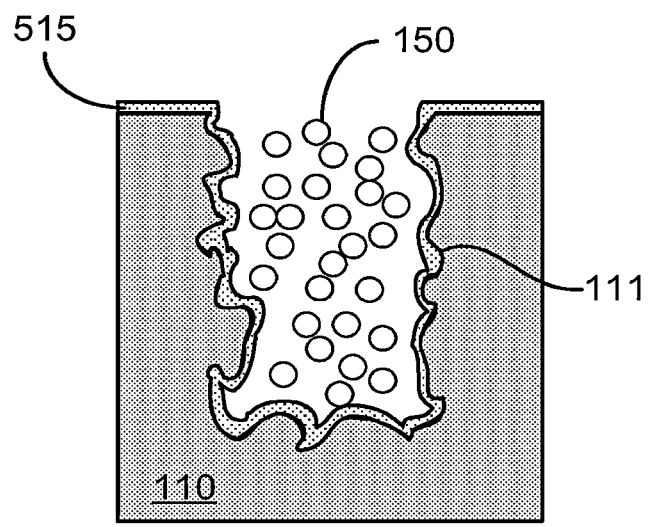
FIG. 5 is a cross-sectional side view illustration of a layer between the electrolyte and porous structure of an energy storage device according to an embodiment of the invention.

In some embodiments, a dielectric layer 515 may be placed between the electrolyte 150 and the channel 111 of the porous structure as illustrated in FIG. 5. The EDL is not shown in FIG. 5 in order to avoid unnecessarily complicating the drawing. The dielectric layer 515 may be introduced to further enhance the capacitance of the energy storage device, or for other reasons such as, but not limited to, surface passivation and wettability enhancement.

In some embodiments, both a dielectric layer and conducting coating may be placed between the electrolyte and at least some of the channels. By using two layers it allows for each layer to be optimized independently for specific parameters. For example, the dielectric layer may be optimized to provide good surface passivation where as the conductive layer may be optimized to provided low ESR.

Figure 6:
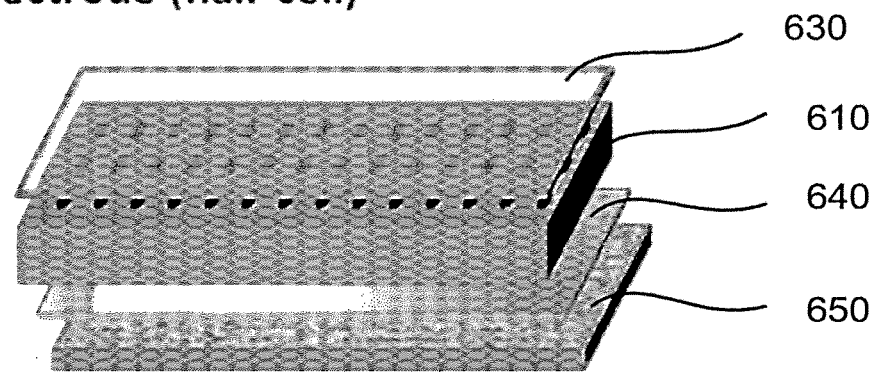
FIG. 6 includes isometric view illustrations of half cell and full cell energy storage devices integrated into a casing of a mobile device according to embodiments of the invention.
Figure 6:
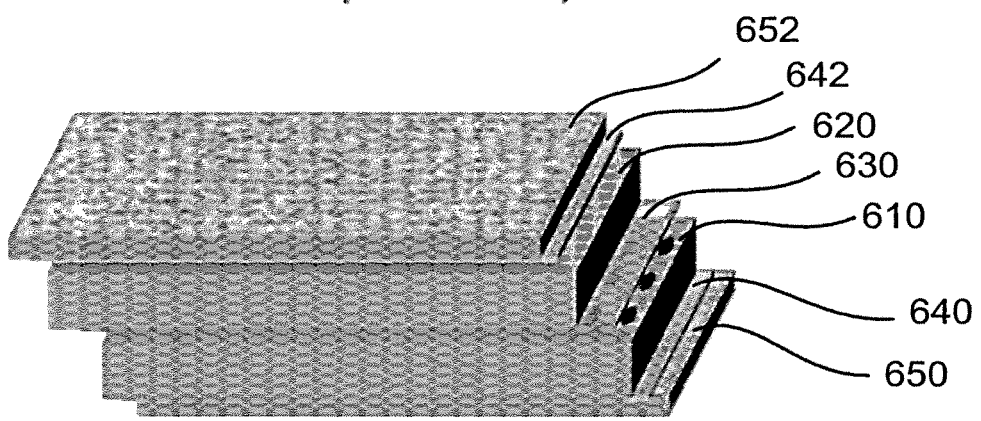

As previously described, embodiments of the invention provide versatile methods that simplify integration of energy storage devices, for example into packages and casings of electronic devices. For example, energy storage devices may be integrated into the casing of a mobile telephone, laptop or tablet, or integrated into the structure of a mobile telephone, laptop or tablet. For example, this may be accomplished by forming the energy storage device on the casing, or laminating the casing over the energy storage device. FIG. 6 includes isometric view illustrations of half cell and full cell energy storage devices integrated into a casing according to embodiments of the invention. As illustrated, a half cell single electrode structure may include a casing 650, an electrically conductive film 640, electrically conductive porous structure 610 and a solid or semi-solid electrolyte layer 630. As illustrated, a whole cell structure may include a pair of casings 650, 652, a pair of electrically conductive films 640, 642, a pair of electrically conductive porous structures 610, 620 and a solid or semi-solid electrolyte layer 630.

The electrically conductive porous structures 610, 620 may be substantially similar to the electrically conductive structures 110, 120 previously described above. In an embodiment, the solid or semi-solid electrolyte layer 630 separates and penetrates into the pair of electrically conductive porous structures 610, 620. The electrically conductive films 640, 642 may be formed of any material suitable for functioning as collectors. For example, films 640, 642 may be, but are not limited to aluminum or polysilicon films. In an embodiment, electrically conductive films 640, 642 are not present.

In an embodiment, the pair of electrically conductive porous structures 610, 620 are porous semiconductor structures, such as porous silicon, and the solid or semi-solid electrolyte layer 630 penetrates into the pair of porous silicon structures and also separates the pair of porous silicon structures. In a particular embodiment, the pair of porous silicon structures are loaded with a liquid electrolyte, and the solid or semi-solid electrolyte layer 630 comprises a polymer matrix.

FIGS. 7-10 are flowcharts illustrating methods of forming energy storage devices in accordance with embodiments of the invention. In order to not obscure certain aspects of the embodiments, certain features, operations or methods may not be repeatedly described with regard to each and every flowchart where the features, operations or methods may be shared.

Figure 7:
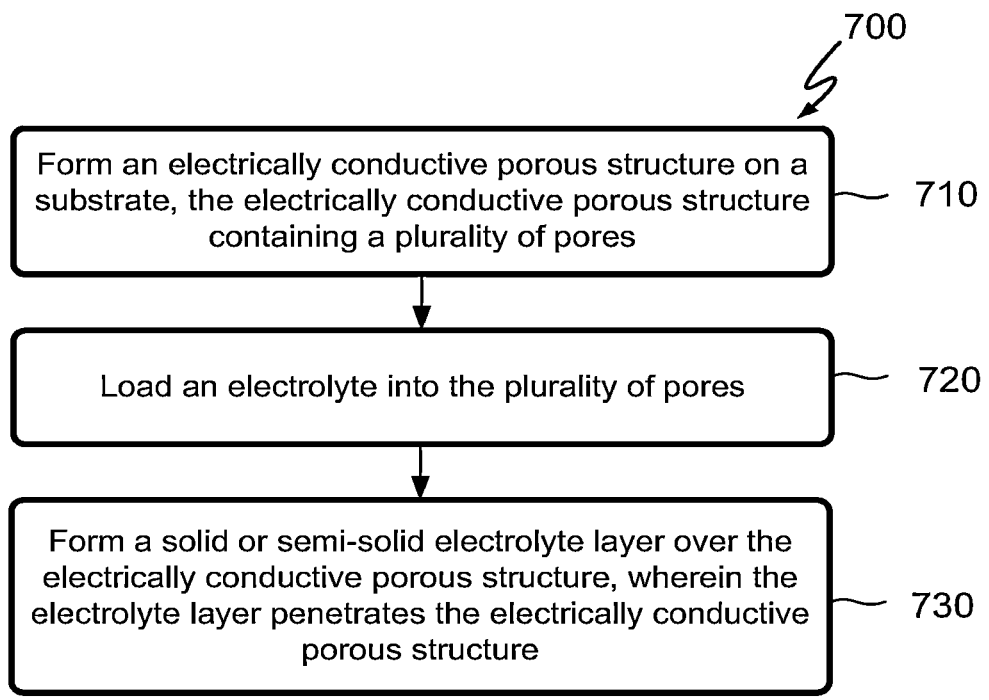
FIG. 7 is a flowchart illustrating a method of forming a half cell energy storage device according to an embodiment of the invention.

FIG. 7 is a flowchart illustrating a method 700 of forming a half cell energy storage device according to an embodiment of the invention. At operation 710 an electrically conductive porous structure is formed on a substrate, with the electrically conductive porous structure containing a plurality of pores. The substrate may be a variety of substrates including a circuit board, package, silicon bridge, casing, glass or an electrically conductive film such as a collector. The substrate can also be a flexible substrate. The electrically conductive porous structure can be formed by a variety of techniques including thermal spraying or casting following by electrochemical etching, aerogel techniques including depositing a gel followed by extracting a liquid component from the gel through supercritical drying or freeze drying, electrospinning conductive nanostructures onto a substrate, or casting of porous particles which may or may not be followed by etching. In an embodiment, the electrically conductive porous structure is a porous semiconductor structure formed by thermal spraying onto the substrate followed by electrochemical etching.

An electrolyte is then loaded into the plurality of pores of the electrically conductive porous structure at operation 720. In an embodiment, loading of the electrolyte into the plurality of pores comprises applying a liquid electrolyte solution to the electrically conductive porous structure and allowing the liquid electrolyte solution to be taken up into the plurality of pores. Vacuum techniques can also be utilized to assist in the take-up of the liquid electrolyte solution. In an embodiment, where the electrically conductive porous structure is formed by an aerogel technique, the loading the plurality of pores may include introducing a liquid electrolyte solution to the electrically porous structure while compressed, and allowing the electrically conductive porous structure to expand to uptake the electrolyte.

At operation 730 a solid or semi-solid electrolyte layer is then formed over the electrically conductive structure, where the electrolyte layer penetrates the electrically conductive porous structure. The electrolyte layer can be formed using a variety of techniques such as, but not limited to, spin casting, spraying and lamination. In an embodiment, penetration of the electrolyte layer into the electrically conductive porous structure is accomplished by forming a liquid or semi-solid electrolyte layer over the electrically porous structure, allowing the electrolyte layer to intermix with the electrolyte already loaded into the plurality of pores, and then polymerizing the electrolyte layer through the application of heat or radiation. In an embodiment, the electrolyte layer may be formed from the liquid electrolyte solution used to load the plurality of pores of the electrically conductive porous structure.

Figure 8:
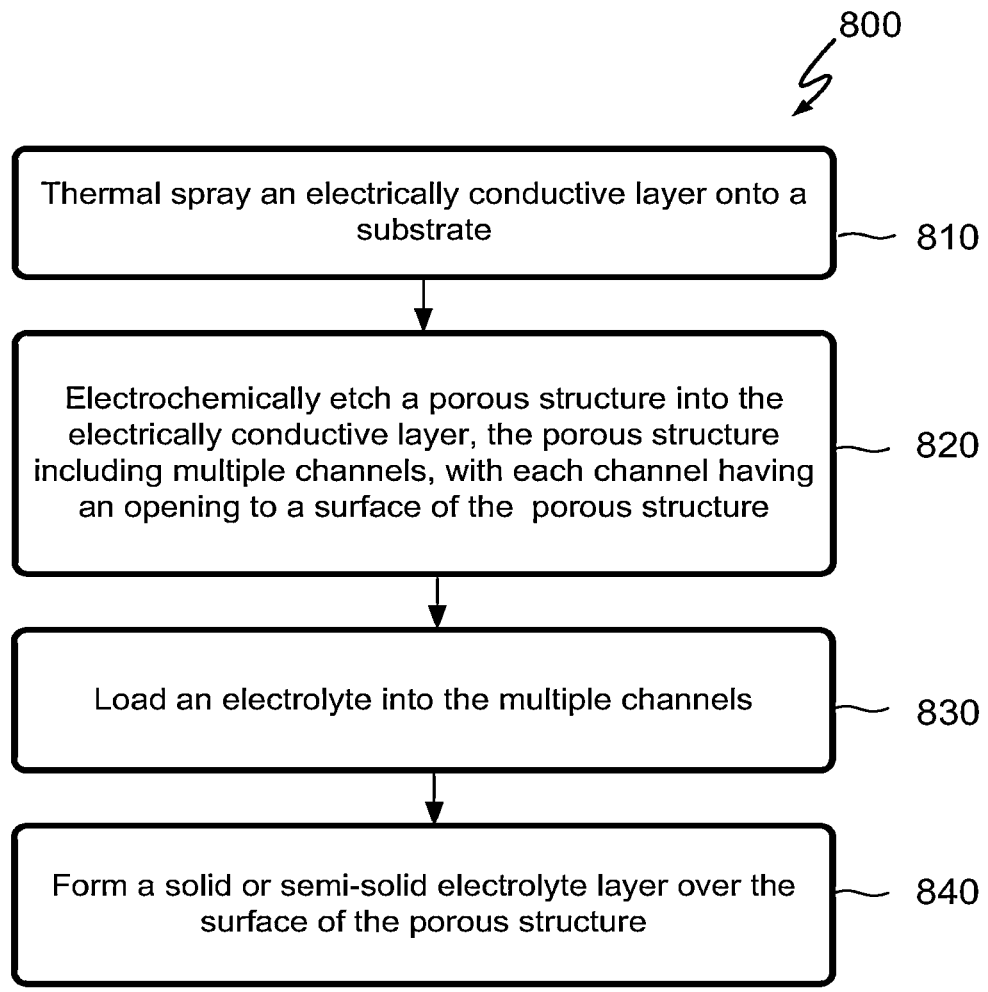
FIG. 8 is a flowchart illustrating a method of forming a half cell energy storage device including thermal spraying and electrochemical etching according to an embodiment of the invention.

FIG. 8 is a flowchart illustrating a method 800 of forming an energy storage device including thermal spraying and electrochemical etching according to an embodiment of the invention. At operation 810 an electrically conductive layer is thermal sprayed onto a substrate. Thermal spraying may include plasma spraying silicon particles and suitable doping with a high-temperature torch using a carrier gas. At operation 820 the electrically conductive layer and substrate are then loaded into an electrochemical etching bath and a porous structure is electrochemically etched into the electrically conductive layer to form a porous structure including multiple channels, with each channel having an opening to a surface of the porous structure as illustrated in FIGS. 1-2. At operations 830 and 840 an electrolyte is loaded into the multiple channels, and a solid or semi-solid electrolyte layer is formed over the surface of the porous structure. In an embodiment, the solid or semi-solid electrolyte layer penetrates the openings to the multiple channels. In an embodiment, the solid or semi-solid electrolyte layer is formed over the surface by first depositing an electrolyte layer over the surface, followed by polymerizing the electrolyte layer to form the solid or semi-solid electrolyte layer.

Figure 9:
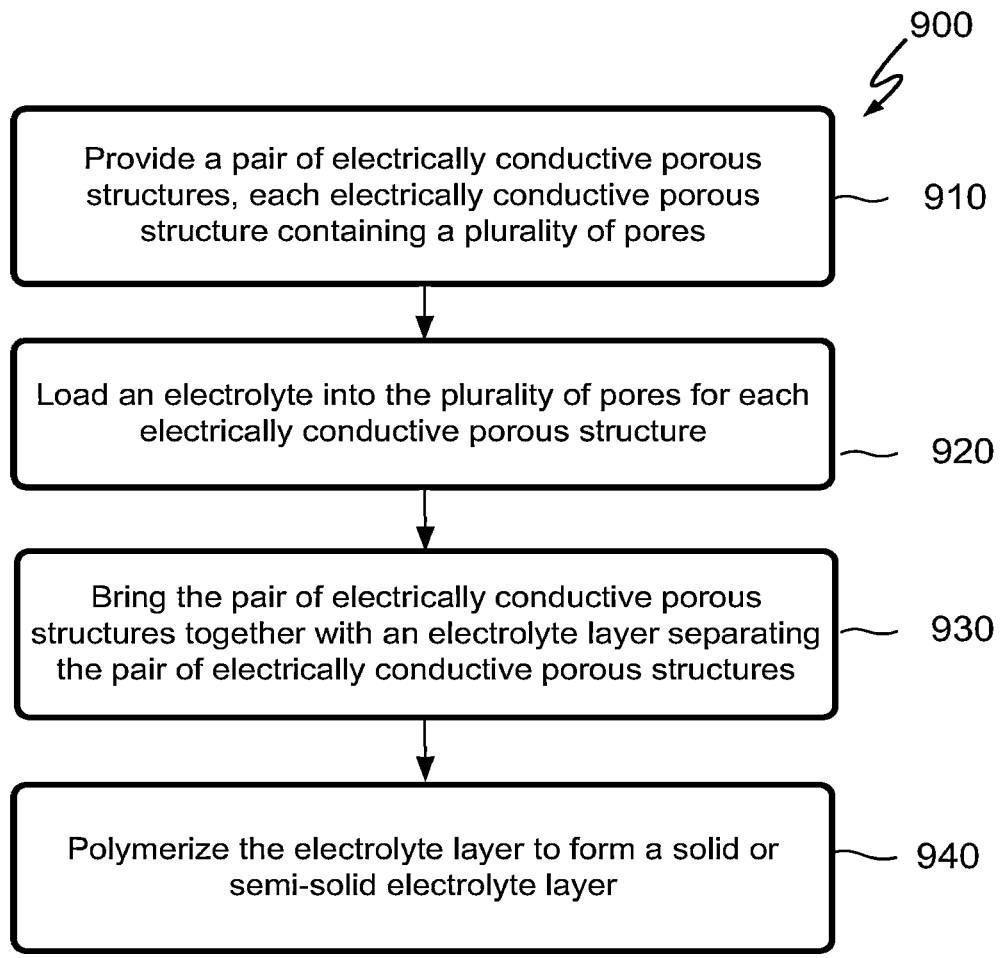
FIG. 9 is a flowchart illustrating a method of forming a whole cell energy storage device according to an embodiment of the invention.

FIG. 9 is a flowchart illustrating a method 900 of forming a whole cell energy storage device according to an embodiment of the invention. At operation 910 a pair of electrically conductive porous structures are provided, with each electrically conductive porous structure containing a plurality of pores. An electrolyte is loaded into the plurality of pores for each of the electrically conductive porous structures at operation 920. Then at operation 930 the pair of electrically conductive porous structures are brought together with an electrolyte layer separating the pair of electrically conductive porous structures. The electrolyte layer separating the pair of electrically conductive porous structures is polymerized at operation 940 to form a solid or semi-solid electrolyte layer. In accordance with embodiments of the invention, the electrolyte layer can be formed and polymerized during a variety of different operations. In an embodiment, the electrolyte layer is polymerized after bringing the pair of electrically conductive porous structures together. For example, the electrolyte layer can be liquid, semi-solid, or even solid prior to polymerization to form the solid or semi-solid electrolyte layer. In an embodiment, the electrolyte layer is deposited onto one of the pair of electrically conductive structures prior to bringing the pair of electrically conductive structures together.

Figure 10:
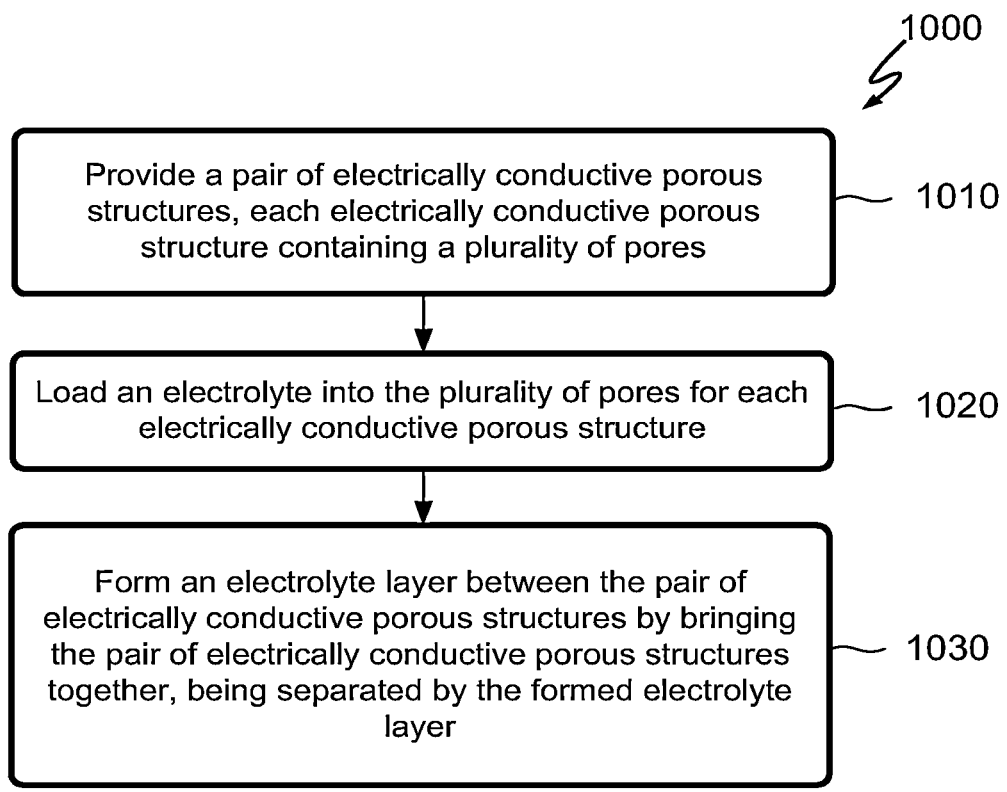
FIG. 10 is a flowchart illustrating a method of forming a whole cell energy storage device according to an embodiment of the invention.

In an embodiment, the electrolyte layer is formed by bringing the pair of electrically conductive structures together. FIG. 10 is a flowchart illustrating a method 1000 of forming a whole cell energy storage device according to an embodiment of the invention. At operation 1010 a pair of electrically conductive porous structures are provided, with each electrically conductive porous structure containing a plurality of pores. An electrolyte is loaded into the plurality of pores for each of the electrically conductive porous structures at operation 1020. At operation 1030 an electrolyte layer is formed between the pair of electrically conductive porous structures by bringing the pair of electrically conductive structures closely together, being separated by the formed electrolyte layer. In an embodiment, the electrolyte layer is then polymerized to form a solid or semi-solid electrolyte layer. In an embodiment, the electrolyte loaded into the plurality of pores for each electrically conductive porous structure and the electrolyte layer are simultaneously polymerized.

Figure 11A:
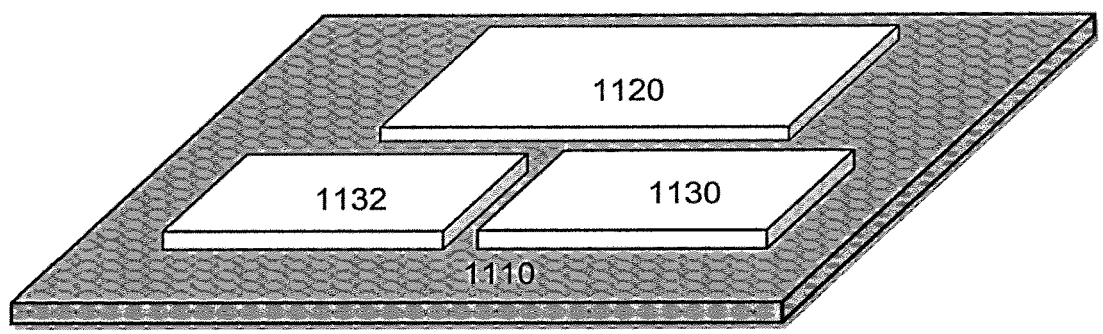
FIG. 11A is an isometric view illustration of a package substrate according to an embodiment of the invention.
Figure 11B:
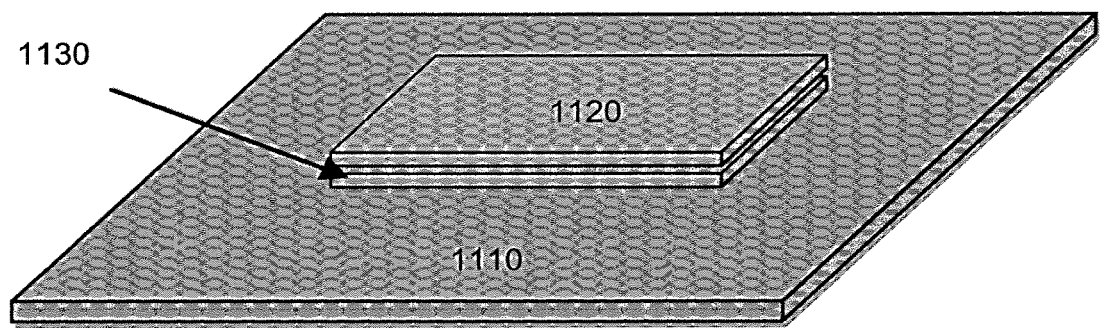
FIG. 11B is an isometric view illustration of a package substrate according to an embodiment of the invention.

FIGS. 11A-11B are isometric view illustrations of a package substrate according to an embodiments of the invention. As illustrated in FIG. 11A, an energy storage device 1130 can be formed on a package substrate 1110. In the embodiment illustrated in FIG. 11A, other devices such as a microprocessor 1120 and memory 1132 are also formed on the package substrate 1110. In an embodiment, the energy storage device 1130 is formed on a silicon bridge between two die. For example, the energy storage device 1130 can be formed on a silicon bridge connecting microprocessor 1120 to another die, such as memory 1132. The embodiment illustrated in FIG. 11B illustrates physical robustness of an energy storage device 1130 which is underneath a microprocessor 1120.

Figure 12:
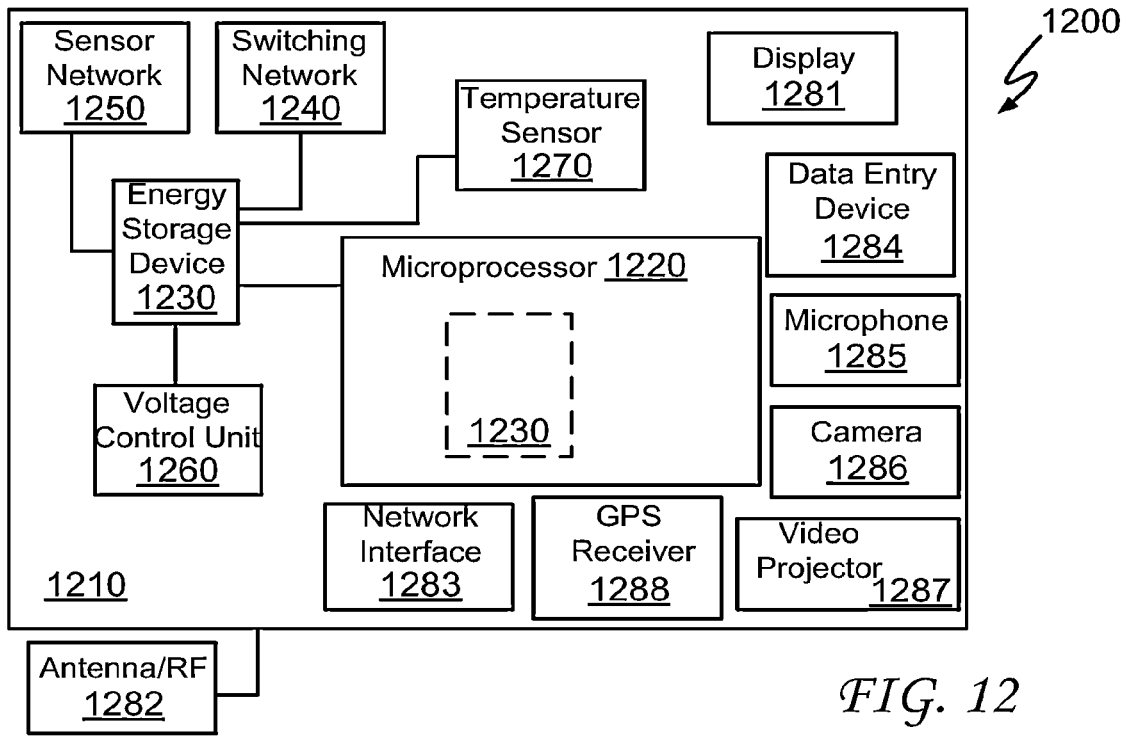
FIG. 12 is a block diagram illustration of a mobile electronic device according to an embodiment of the invention.

FIG. 12 is a block diagram representing a mobile electronic device 1200 according to an embodiment of the invention. As illustrated in FIG. 12, mobile electronic device 1200 comprises a substrate 1210 on which a microprocessor 1220 and an energy storage device 1230 associated with microprocessor 1220 are disposed. Energy storage device 1230 can either be located on substrate 1210 away from microprocessor 1220, as illustrated in solid lines. In an embodiment, energy storage device is formed on a silicon bridge connecting the microprocessor 1220 to another die on the substrate. Energy storage device 1230 can also be located on or underneath microprocessor 1220 itself, as illustrated in dashed lines. In an embodiment, energy storage device 1230 is integrated into a casing of the mobile electronic device. In one embodiment energy storage device 1230 comprises first and second electrically conductive structures separated from each other by solid or semi-solid electrolyte layer. In an embodiment the solid or semi-solid electrolyte layer penetrates a porous structure of either or both of the first and second electrically conductive structures. In an embodiment one of the first and second electrically conductive structures comprises a porous structure containing multiple channels. As an example, this embodiment can be similar to one or more of the embodiments shown in FIGS. 1-5 and described in the accompanying text.

In at least some embodiments energy storage device 1230 is one of a plurality of energy storage devices, (all of which are represented in FIG. 12 by block 1230) contained within mobile electronic device 1200. In one or more of those embodiments mobile electronic device 1200 further comprises a switching network 1240 associated with the energy storage devices. When a capacitor is being discharged it doesn't maintain a constant voltage but instead decays in an exponential manner (unlike a battery where the voltage stays relatively constant during discharge). Switching network 1240 comprises circuitry or some other mechanism that switches in and out various capacitors such that a relatively constant voltage is maintained. For example, the energy storage devices could initially be connected to each other in parallel and then, after a certain amount of voltage decay, a subset of the energy storage devices could be changed by the switching network so as to be connected in series such that their individual voltage contributions can boost the declining overall voltage. In one embodiment switching network 1240 could be implemented using existing silicon device technology as used in the art (transistors, silicon controlled rectifiers (SCRs), etc.), while in other embodiments it could be implemented using micro-electromechanical systems (MEMS) relays or switches (which, it may be noted, tend to have very low resistance).

In some embodiments mobile electronic device 1200 further comprises a sensor network 1250 associated with energy storage devices 1230. In at least some embodiments each one of the plurality of energy storage devices will have its own sensor that indicates certain behavioral parameters of the energy storage device. For example, the sensors may indicate existing voltage levels as well as the ongoing discharge response, both of which are parameters that may be used by the switching network—especially in cases where the dielectric material (or other electrical insulator) being used is not linear but rather has a dielectric constant that varies with the voltage. In those cases, it may be advantageous to include along with the sensor network a finite state machine such as a voltage control unit 1260 that knows what the behavior of the dielectric is and responds accordingly. A voltage control unit that knows how the dielectric behaves can compensate for any non-linearity. A temperature sensor 1270 associated with energy storage devices 1230 may also be included in order to sense temperature (or other safety-related parameters). In certain embodiments of the invention, mobile electronic device 1200 further comprises one or more of: a display 1281, antenna/RF elements 1282, a network interface 1283, a data entry device 1284 (e.g., a keypad or a touchscreen), a microphone 1285, a camera 1286, a video projector 1287, a global positioning system (GPS) receiver 1288, and the like.

Figure 13:
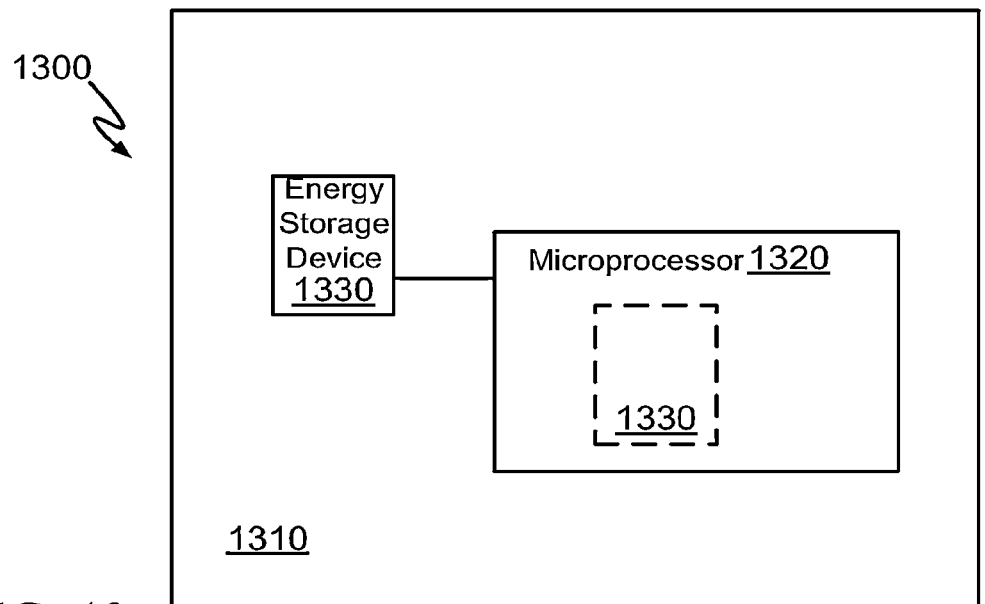
FIG. 13 is a block diagram illustration of a microelectronic device according to an embodiment of the invention.

FIG. 13 is a block diagram representing a microelectronic device 1300 according to an embodiment of the invention. As illustrated in FIG. 13, microelectronic device 1300 comprises a substrate 1310, a microprocessor 1320 over substrate 1310, and an energy storage device 1330 associated with microprocessor 1320. Energy storage device 1330 can either be located on substrate 1310 away from microprocessor 1320 (e.g., a die-side capacitor, or on a silicon bridge), as illustrated in solid lines, or it can be located on or underneath microprocessor 1320 itself (e.g., in a build-up layer above the microprocessor), as illustrated in dashed lines. Energy storage device 1230 can also be integrated into a casing of the microelectronic device. In one embodiment, energy storage device 1330 comprises first and second electrically conductive structures separated from each other by a solid or semi-solid electrolyte layer, where at least one of the first and second electrically conductive structures comprises a porous structure. In an embodiment the solid or semi-solid electrolyte layer penetrates a porous structure of either or both of the first and second electrically conductive structures. In an embodiment one of the first and second electrically conductive structures comprises a porous structure containing multiple channels. As an example, this embodiment can be similar to one or more of the embodiments shown in FIGS. 1-5 and described in the accompanying text.

The energy storage devices disclosed herein may in some embodiments be used as a decoupling capacitor within microelectronic device 1300—one that is smaller and that, for the reasons described elsewhere herein, offers much higher capacitance and much lower impedance than existing decoupling capacitors. As already mentioned, energy storage device 1330 can be part of a support integrated circuit (IC) or chip or it can be located on or underneath the microprocessor die itself. As an example, one might, according to embodiments of the invention, be able to form regions of porous silicon (or the like, as described above) on a microprocessor die and then create a high-surface-area embedded decoupling capacitor right on the substrate of the microprocessor die. Because of the porosity of the silicon, the embedded capacitor would have very high surface area. Other possible uses for the disclosed energy storage devices include use as a memory storage element (where problems with the z-direction size of embedded DRAM approaches may be solved by greatly increasing the farads per unit area) or as a component of voltage converters in voltage boost circuitry, perhaps for use with circuit blocks, individual microprocessor cores, or the like.

As an example, higher capacitance values could in this context be advantageous because parts of the circuit could then run nominally at a certain (relatively low) voltage but then in places where higher voltage is needed in order to increase speed (e.g., cache memory, input/output (I/O) applications) the voltage could be boosted to a higher value. An operational scheme of this sort would likely be preferred over one in which the higher voltage is used everywhere; i.e., in cases where only a small amount of circuitry requires a higher voltage it likely would be preferable to boost voltage from a lower baseline voltage for that small portion of the circuit rather than drop voltage from a higher baseline value for the majority of the circuitry. Future microprocessor generations may also make use of voltage converters of the type described here. Having more capacitance available to be deployed around a package or around a microprocessor die may help solve the existing issue of intolerably high inductance between transistors that transfer voltage around a circuit.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An energy storage device comprising:
   a pair of porous semiconductor structures, each porous semiconductor structure containing an electrolyte loaded into a plurality of pores; and
   a solid or semi-solid electrolyte layer separating the pair of porous semiconductor structures and penetrating the pair of porous semiconductor structures.

2. The energy storage device of claim 1, wherein the electrolyte layer comprises a polymer matrix.

3. The energy storage device of claim 2, wherein the electrolyte layer further comprises an ionic liquid.

4. The energy storage device of claim 2, wherein the polymer matrix comprises a co-polymer.

5. The energy storage device of claim 4, wherein the co-polymer comprises:
a first polymer to provide a structural backbone of the polymer matrix; and
a second polymer to provide ionic conductivity between the pair of electrically conductive porous structures.

6. The energy storage device of claim 4, wherein the co-polymer comprises polyimide and polyethylene oxide.

7. The energy storage device of claim 5, wherein the first polymer has a higher molecular weight than the second polymer.

8. The energy storage device of claim 2, wherein the pair of porous semiconductor structures comprise a material selected from the group consisting of silicon, germanium, silicon-carbide, and silicon-germanium.

9. The energy storage device of claim 2, wherein the pair of porous semiconductor structures comprise silicon.

10. The energy storage device of claim 1, wherein the energy storage device is incorporated within an electronic device, the energy storage device being associated with a microprocessor.

11. The energy storage device of claim 10, wherein the energy storage device is formed within a casing of a mobile electronic device.

12. The energy storage device of claim 11, wherein mobile electronic device is selected from the group consisting of a mobile telephone, a laptop computer, and a tablet computer.

13. The energy storage device of claim 1, wherein the energy storage device is formed on a silicon bridge connecting two die.

14. An energy storage device comprising:
a pair of porous semiconductor structures, each porous semiconductor structure containing an electrolyte loaded into a plurality of pores, wherein the pair of porous semiconductor structures comprise silicon, and further wherein the plurality of pores includes multiple channels, with each channel having an opening to a surface of the porous semiconductor structure, and the electrolyte is loaded into the multiple channels; and
a solid or semi-solid electrolyte layer separating the pair of porous semiconductor structures and penetrating the pair of porous semiconductor structures, wherein the electrolyte layer comprises a polymer matrix.

15. The energy storage device of claim 14, further comprising a coating in at least some of the channels, the coating selected from the group consisting of an electrically conductive coating and a dielectric coating.

16. A method of forming an energy storage device comprising:
forming an electrically conductive porous structure on a substrate, the electrically conductive porous structure containing a plurality of pores, wherein forming the electrically conductive porous structure on the substrate comprises
depositing a gel on the substrate; and
extracting a liquid component from the gel through supercritical drying;
loading an electrolyte into the plurality of pores; and
forming a solid or semi-solid electrolyte layer over the electrically conductive porous structure, wherein the electrolyte layer penetrates the electrically conductive porous structure.

17. The method of 16, wherein forming the electrically conductive porous structure on the substrate comprises:
thermal spraying an electrically conductive layer onto the substrate; and
electrochemically etching a porous structure into the electrically conductive layer.

18. The method of claim 17, wherein thermal spraying the electrically conductive layer onto the substrate comprises thermal spraying silicon onto the substrate.

19. The method of claim 16, wherein loading the electrolyte into the plurality of pores comprises introducing the electrolyte to the electrically conductive porous structure while compressed, and allowing the electrically conductive porous structure to expand to uptake the electrolyte.

20. The method of claim 16, wherein loading the electrolyte into the plurality of pores comprises introducing the electrolyte to the electrically conductive porous structure while under vacuum.

21. The method of claim 16, wherein the electrically conductive porous structure comprises a material selected from the group consisting of silicon, carbon, vanadium, molybdenum, ruthenium, and manganese.

22. The method of claim 16, further comprising incorporating the energy storage device within an electronic device and in association with a microprocessor.

23. The method of claim 16, further comprising forming the energy storage device within a casing of a mobile electronic device.

24. The method of claim 16, wherein forming the electrically conductive porous structure on the substrate comprises:
electrospinning conductive nanostructures onto the substrate.

25. The method of claim 16, wherein the substrate is a flexible substrate.

26. A method of forming an energy storage device comprising:
thermal spraying an electrically conductive layer onto a substrate;
electrochemically etching a porous structure into the electrically conductive layer, the porous structure including multiple channels, with each channel having an opening to a surface of the porous structure;
loading an electrolyte into the multiple channels; and
forming a solid or semi-solid electrolyte layer over the surface of the porous structure.

27. The method of claim 26, wherein the electrolyte layer penetrates the openings to the multiple channels.

28. The method of claim 26, wherein forming the solid or semi-solid electrolyte layer over the surface comprises forming an electrolyte layer over the surface, followed by polymerizing the electrolyte layer to form the solid or semi-solid electrolyte layer.

29. The method of claim 26, wherein thermal spraying the electrically conductive layer onto the substrate comprises thermal spraying silicon onto the substrate.

30. A method of forming an energy storage device comprising:
providing a pair of electrically conductive porous structures, each electrically conductive porous structure containing a plurality of pores;
loading an electrolyte into the plurality of pores for each electrically conductive porous structure; and
bringing the pair of electrically conductive porous structures together with an electrolyte layer separating the pair of electrically conductive porous structures; and
polymerizing the electrolyte layer to form a solid or semi-solid electrolyte layer.

31. The method of claim 30, further comprising polymerizing the electrolyte layer after bringing the pair of electrically conductive porous structures together.

32. The method of claim 30, further comprising depositing the electrolyte layer onto one of the pair of electrically conductive porous structures prior to bringing the pair of electrically conductive porous structures together.

33. The method of claim 30, wherein the electrolyte layer separating the pair of electrically conductive porous structures is formed by bringing together the pair of electrically conductive porous structures loaded with the electrolyte.

34. The method of claim 33, further comprising simultaneously polymerizing the electrolyte loaded into the plurality of pores for each electrically conductive porous structure and the electrolyte layer.

* * * * *